(12) United States Patent
Ko et al.

(10) Patent No.: US 8,866,228 B2
(45) Date of Patent: Oct. 21, 2014

(54) DIODE AND ELECTROSTATIC DISCHARGE PROTECTION CIRCUIT INCLUDING THE SAME

(75) Inventors: Jaehyok Ko, Hwaseong-si (KR); Hangu Kim, Seongnam-si (KR); ChangSu Kim, Hwaseong-si (KR); Dongryul Chang, Suwon-si (KR); Minchang Ko, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 391 days.

(21) Appl. No.: 13/242,374

(22) Filed: Sep. 23, 2011

(65) Prior Publication Data

US 2012/0161298 A1    Jun. 28, 2012

(30) Foreign Application Priority Data

Dec. 22, 2010    (KR) .................. 10-2010-0132642

(51) Int. Cl.
*H01L 23/62*    (2006.01)
*H01L 27/02*    (2006.01)

(52) U.S. Cl.
CPC ................................. *H01L 27/0255* (2013.01)
USPC ........................ 257/355; 257/546; 257/601

(58) Field of Classification Search
CPC ............ H01L 27/0248; H01L 27/0255; H01L 27/0814; H01L 29/861; H01L 29/66136; H01L 29/7391
USPC .................................... 257/355, 546, 594, 601
See application file for complete search history.

(56) References Cited

U.S. PATENT DOCUMENTS

| 6,590,264 B2 * | 7/2003 | Ker et al. ........................ 257/355 |
| 6,690,065 B2 * | 2/2004 | Chang et al. ................... 257/355 |
| 2010/0127259 A1 * | 5/2010 | Nozu ............................... 257/49 |

FOREIGN PATENT DOCUMENTS

| JP | 2005-223016 | 8/2005 |
| JP | 2007-116053 | 5/2007 |
| KR | 100222078 | 7/1999 |
| KR | 1020070061264 | 6/2007 |

\* cited by examiner

*Primary Examiner* — Matthew E Warren
(74) *Attorney, Agent, or Firm* — F. Chau & Associates, LLC (57) ABSTRACT

A diode includes a first region having a first conductive type impurity and formed in a first well having the first conductive type impurity, a second region formed in the first well and having a second conductive type impurity, and a semiconductor pattern disposed above the first well and including a first portion having the first conductive type impurity and a second portion having the second conductive type impurity. The first region and the first portion are coupled with an anode, and the second region and the second portion are coupled with a cathode.

14 Claims, 7 Drawing Sheets

DIODE AND ELECTROSTATIC DISCHARGE PROTECTION CIRCUIT INCLUDING THE SAME

CROSS-REFERENCE TO RELATED APPLICATIONS

This application claims priority, under 35 U.S.C §119, to Korean Patent Application No. 10-2010-0132642 filed Dec. 22, 2010, the disclosure of which is hereby incorporated by reference herein in it's entirety.

BACKGROUND

1. Technical Field

Exemplary embodiments relate to a diode and an electrostatic discharge protection circuit including the same.

2. Description of the Related Art

When charged human or metal is contact with integrated circuit device, static electricity may be discharged at the integrated circuit device. If discharged static electricity flows in the integrated circuit device, its characteristic may be changed. This in turn may cause abnormal operation of the integrated circuit device.

Static electricity flows in/out and from/to an integrated circuit device through input/output pads of the integrated circuit device. For example, the static electricity may flow in the integrated circuit device by the human body model (HBM) and machine model (MM). The integrated circuit device has an electrostatic discharge protection circuit for protecting internal circuits from the electrostatic discharge (ESD).

As the integrated circuit device is scaled down, an electrostatic discharge protection circuit occupying a small area may be required. Further, the integrated circuit device may be easily damaged by the static electricity due to an increase in integration of the integrated circuit device. Accordingly, to protect internal circuits of the integrated circuit device from the electrostatic discharge, an electrostatic discharge protection circuit occupying a small area may be required.

SUMMARY

Exemplary embodiments of the inventive concept may increase the integration of a diode of an electrostatic discharge protection circuit.

In accordance with an exemplary embodiment of the inventive concept, a diode is provided. The diode includes a first region having a first conductivity type impurity and is formed in a first well having first conductive type impurity, a second region formed in the first well and having a second conductive type impurity and a semiconductor pattern disposed above the first well and including a first portion having the first conductive type impurity and a second portion having the second conductive type impurity. The first region and the first portion are coupled with an anode, and the second region and the second portion are coupled with a cathode.

In this embodiment, a depletion layer is disposed between the first and second portions and is disposed non-parallel with a surface of the first well.

In this embodiment, the semiconductor pattern is disposed between the first and second regions, the first region is disposed adjacent to the first portion, and the second region is disposed adjacent to the second portion.

In this embodiment, the first well is formed within a second well having the second conductive type impurity, and the first and second wells are formed in a substrate having the first conductive type.

In this embodiment, the semiconductor pattern is formed of polysilicon.

In this embodiment, the semiconductor pattern further comprises a third portion disposed between the first and second portions, and the third portion has a concentration smaller than a concentration of the first portion and has the first conductive type impurity.

In this embodiment, the semiconductor pattern further comprises a third portion disposed between the first and second portions, and the third portion has a concentration smaller than a concentration of the second portion and has the second conductive type impurity.

In this embodiment, the diode further comprises an isolation pattern formed in the first well and disposed between the first and second regions.

In this embodiment, the diode further comprises a third region formed in a second well having the second conductive type impurity. The third region has the second conductive type impurity, and the first well is formed in the second well and the third region is coupled with the cathode.

In this embodiment, the first and second wells are formed in a substrate having the first conductive type.

In this embodiment, the diode further comprises a fourth region formed in the second well and the fourth region has the first conductive type impurity. The fourth region is coupled with the anode.

In accordance with an exemplary embodiment of the inventive concept, a diode is provided. The diode includes a plurality of semiconductor patterns disposed above a substrate and each of the semiconductor patterns includes a portion having a first conductive type impurity and a portion having a second conductive type impurity and a plurality of regions including a first region and a second region formed in the substrate. The first region has the first conductive type impurity and the second region has the second conductive type impurity. The portion having the first conductive type impurity and the region having the first conductive type impurity are coupled with an anode, and the portion having the second conductive type impurity and the region having the second conductive type impurity are coupled with a cathode.

In this embodiment, the semiconductor patterns and the regions are disposed in turn.

In this embodiment, the diode further comprises isolation patterns formed in the substrate and disposed among the regions to divide the regions.

In this embodiment, the first region is formed in a first well and the second region is formed in a second well, and the first well has the first conductive type impurity and the second well has the second conductive type impurity. In addition, the first well is formed in the second well.

In this embodiment, the diode further comprises an insulation film disposed between the substrate and the semiconductor patterns.

In this embodiment, a depletion layer is disposed between the portions of each of the semiconductor patterns, which have the first and second conductive type impurities, respectively. The depletion layer is also disposed to be non-parallel with a surface of the substrate.

In accordance with an exemplary embodiment of the inventive concept, an electrostatic discharge protection circuit is provided. The electrostatic discharge protection circuit includes a first diode and a second diode configured to provide a path of discharging a static electricity flowing in an input/output pad, and each of the first and second diodes include a well having a first conductive type impurity and including a first region having the first conductive type impurity and a second region having a second conductive type impurity and a semiconductor pattern disposed above the well and including a first portion having the first conductive type impurity and a second portion having the second conductive type impurity. The first region and the first portion are coupled with an anode, and the second region and the second portion are coupled with a cathode, and the static electricity flowing in from the input/output pad is discharged via the first and second diodes by connecting an anode of the first diode and a cathode of the second diode to the input/output pad.

In this embodiment, the electrostatic discharge protection circuit further includes a power clamp circuit connected with a cathode of the first diode and a ground node, and positive charges included in the static electricity are discharged to the ground node through the first diode and the power clamp circuit.

In this embodiment, the anode of the second diode is grounded, and negative charges of the static electricity are discharged to the ground node through the second diode.

In accordance with an exemplary embodiment of the inventive concept, a diode is provided. The diode includes a first semiconductor pattern, a second semiconductor pattern, a third semiconductor pattern and a fourth semiconductor pattern each disposed above a P-type substrate, and each of the first, second, third and fourth semiconductor patterns include a heavily doped N-type portion N+, one of a lightly doped N-type portion N− or a lightly doped P-type portion, and a heavily doped P-type portion P+. The diode further includes a plurality of regions formed in the substrate, and the plurality of regions include a first N-type region, a second N-type region, a third N-type region, a first P-type region and a second P-type region. The first N-type region and the second N-type region are formed in a first N-type well located in the substrate, and the third N-type region, the first P-type region and the second P-type region are each located in a second P-type well formed within the first N-type well. The first N-type region, the second N-type region, the third N-type region and the heavily doped N-type portions N+ of the first, second, third and fourth semiconductor patterns are each coupled with a cathode, and the first P-type region, the second P-type region, and the heavily doped P-type portions P+ of the first, second, third and fourth semiconductor patterns are each coupled with an anode.

BRIEF DESCRIPTION OF THE DRAWINGS

Exemplary embodiments of the present invention can be understood in more detail from the following description with reference to the following figures, wherein like reference numerals refer to like parts throughout the various figures unless otherwise specified, and wherein.

DETAILED DESCRIPTION

Exemplary embodiments of the inventive concept are described more fully hereinafter with reference to the accompanying drawings, in which exemplary embodiments of the inventive concept are shown. Exemplary embodiments of the inventive concept may, however, be embodied in many different forms and should not be construed as limited to exemplary embodiments set forth herein. In the drawings, the size and relative sizes of layers and regions may be exaggerated for clarity. Like numbers refer to like elements throughout.

Figure 1:
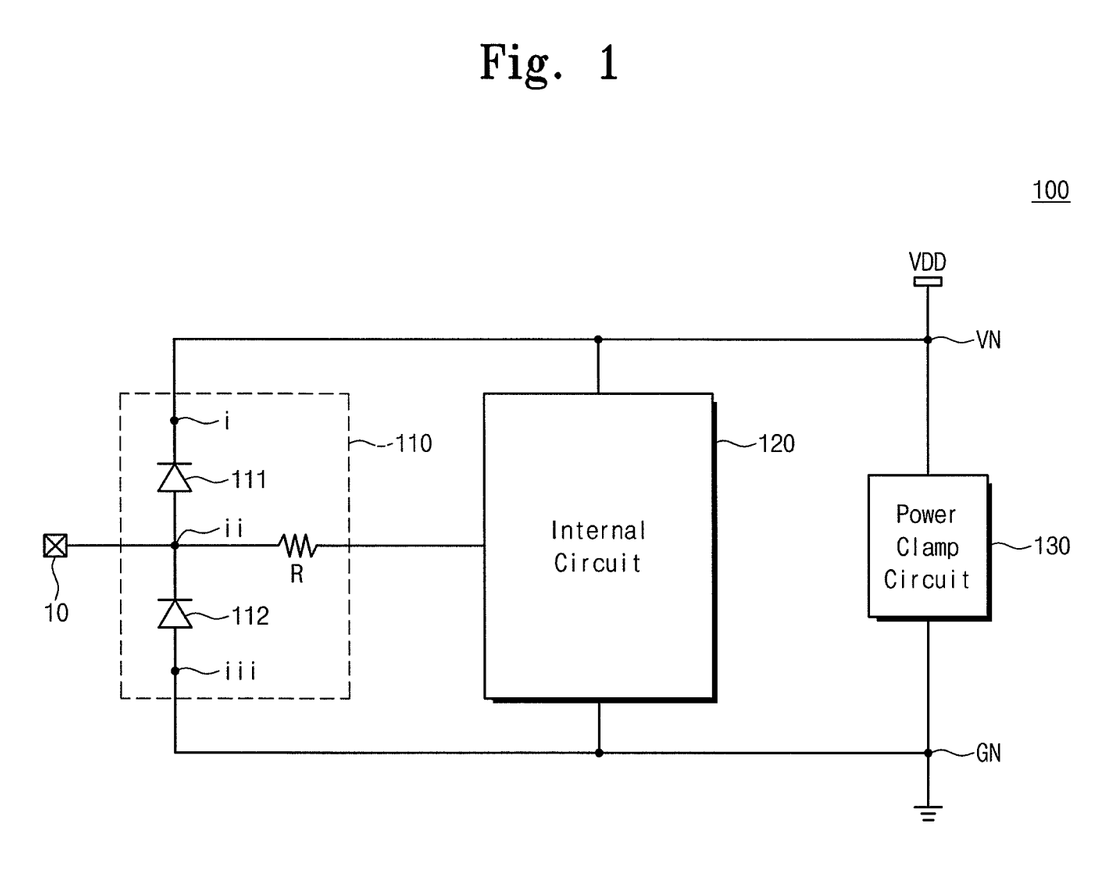
FIG. 1 is a block diagram of an integrated circuit device including an electrostatic discharge protection circuit according to an exemplary embodiment of the inventive concept.

FIG. 1 is a block diagram of an integrated circuit device including an electrostatic discharge protection circuit according to an exemplary embodiment of the inventive concept. An integrated circuit device 100 may include, for example, an electrostatic discharge protection circuit 110, an internal circuit 120, and a power clamp circuit 130.

The electrostatic discharge protection circuit 110 may include, for example, the first and second diodes 111 and 112 and a resistor R. The electrostatic discharge protection circuit 110 may provide a discharge path for discharging the static electricity flowing in from an input/output pad 10.

The equivalent impedance of each of the first and second diodes 111 and 112 may be less than, for example, that of the resistor R and the internal circuit 120. Accordingly, the static electricity flowing in from the input/output pad 10 flows through the first diode 111 or the second diode 112 without flowing into the internal circuit 120. Unlike the illustration of FIG. 1, alternatively, the electrostatic discharge protection circuit 110 can be formed not to include the resistor R. At this time, the equivalent impedance of the first and second diodes 111 and 112 may be, for example, less than that of the internal circuit 120, respectively.

The first diode 111 may be coupled with, for example, the first node (i) and the second node (ii). For example, the first node (i) may be a cathode of the first diode 111, and the second node (ii) may be an anode of the first diode 111.

The second diode 112 may be, for example, coupled with the second node (ii) and the third node (iii). For example, the second node (ii) may be a cathode of the second diode 112, and the third node (iii) may be an anode of the second diode 112.

If positive charges are received from an anode, a diode may output positive charges via a cathode. If negative charges are received from an anode, a diode may output negative charges via a cathode.

In the event that positive charges are received from the input/output pad 10, the first diode 111 may provide a discharge path between a power node VN and the input/output pad 10. Positive charges flowing in via the second node (ii) from the input/output pad 10 may be discharged to a ground node GN through the first diode 111, the first node (i), and the power clamp circuit 130.

When negative charges are received from the input/output pad 10, the second diode 112 may provide a discharge path between the ground node GN and the input/output pad 10. Negative charges flowing in through the second node (ii) from the input/output pad 10 may be discharged to the ground node GN through the second diode 112.

A power supply voltage VDD may be applied to the internal circuit 120. The internal circuit 120 may operate using the power supply voltage VDD. The internal circuit 120 may receive an input signal from the input/output pad 10 and transfer an output signal to the input/output pad 10 based on the input signal.

The power clamp circuit 130 may discharge charges flowing in from the power node VN to the ground node GN due to the electrostatic discharge. It is possible to protect the internal circuit 120 by discharging the static electricity.

The electrostatic discharge protection circuit 110 may provide a discharge path for discharging the static electricity flowing in from the input/output pad 10. Accordingly, the static electricity flowing in from the input/output pad 10 may not be applied to the internal circuit 120.

Figure 2:
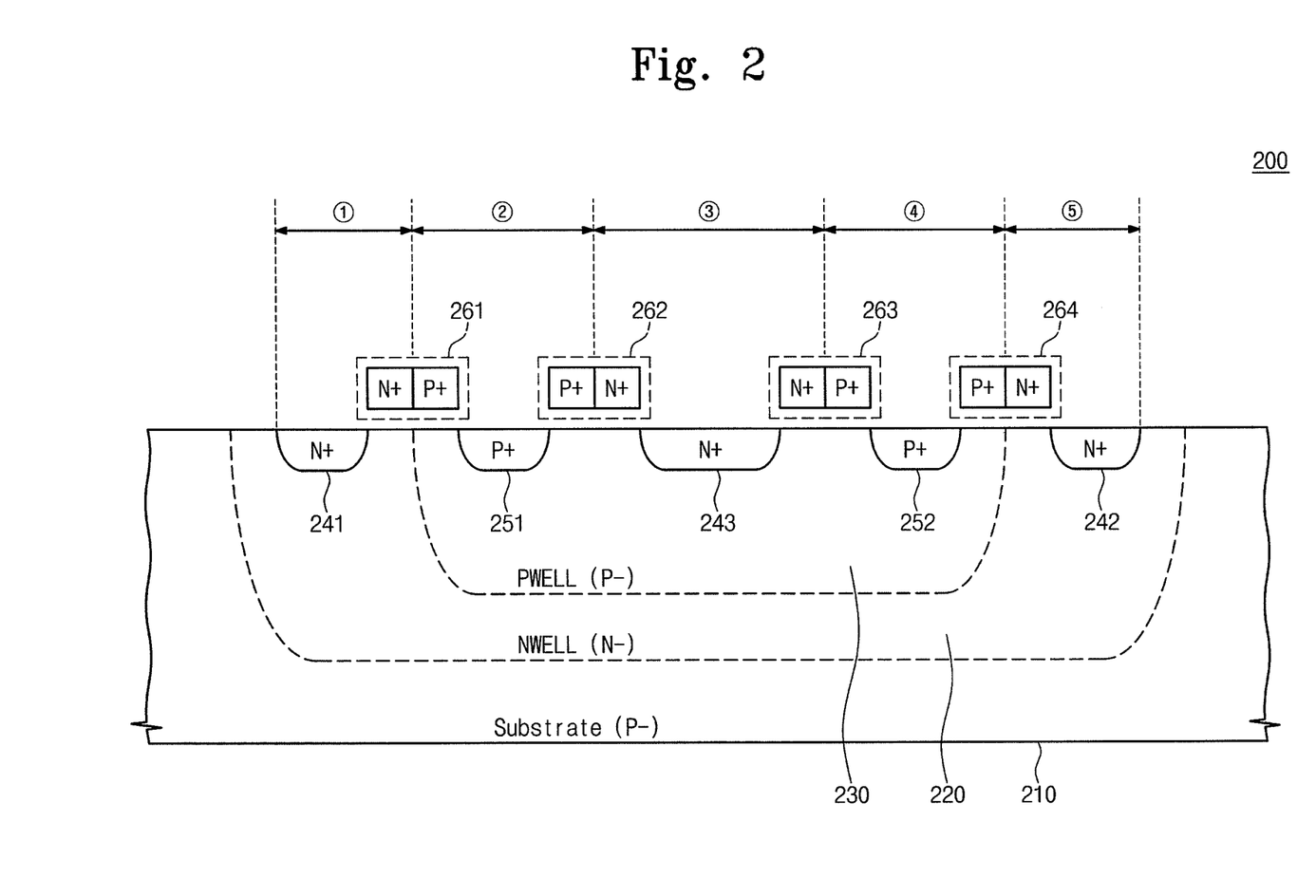
FIG. 2 is a cross-sectional view of a diode according to an exemplary embodiment of the inventive concept.

FIG. 2 is a cross-sectional view of a diode according to an exemplary embodiment of the inventive concept. A diode 200 in FIG. 2 may be either one of the first and second diodes 111 and 112 in FIG. 1.

The diode 200 may include, for example, a substrate 210 and a plurality of semiconductor patterns 261, 262, 263, and 264. The substrate 210 may include, for example, a well 220 (hereinafter, called an N-type well) introduced by N-type impurity and a well 230 (hereinafter, called a P-type well) introduced by P-type impurity. That is, the N-type well 220 may be formed in the substrate 210, and the P-type well 230 may be formed in the N-type well 220. This well structure may be called a pocket P-well structure. The concentration of the P-type impurity of the P-type well 230 may be, for example, more than the concentration of the P-type impurity of the substrate 210.

The N-type well 220 may include, for example, the first and second N-type regions 241 and 242 which are doped by N-type impurity. The P-type well 230 may include, for example, the first and second P-type regions 251 and 252 doped by P-type impurity and the third N-type region 243 doped by N-type impurity.

The doping concentration (represented by N+ in FIG. 2) of each of the first to third N-type regions 241 to 243 may be, for example, larger than the doping concentration (represented by N− in FIG. 2) of the N-type well 220. The doping concentration (represented by P+ in FIG. 2) of each of the first and second P-type regions 251 and 252 may be, for example, larger than the doping concentration (represented by P− in FIG. 2) of the P-type well 230.

According to an exemplary embodiment of the inventive concept, the diode 200 may include, for example, a plurality of semiconductor patterns 261 to 264. The plurality of semiconductor patterns 261 to 264 may be formed of, for example, a polysilicon element. For example, the plurality of semiconductor patterns 261 to 264 may be formed of poly crystalline, and the substrate 210 may be formed of single crystalline.

The plurality of semiconductor patterns 261 to 264 may be formed above the substrate 210. An insulation material may be disposed between the substrate 210 and the plurality of semiconductor patterns 261 to 264. In an exemplary embodiment, the insulation material may be formed of, for example, silicon oxide ($SiO_2$). The thickness of the insulation material may be determined such that no current path is formed at the P-type and N-type wells 230 and 220 below the plurality of semiconductor patterns 261 to 264 due to voltages applied to the plurality of semiconductor patterns 261 to 264. The plurality of semiconductor patterns 261 to 264 and the N-type and P-type regions 241, 251, 243, 252, and 242 may be placed in turn.

The plurality of semiconductor patterns 261 to 264 may be formed of, for example, a PN junction, respectively. That is, the plurality of semiconductor patterns 261 to 264 may include, for example, a portion doped by a P-type impurity and a portion doped by an N-type impurity. For example, in the respective semiconductor patterns 261 to 264, a depletion layer (not shown) between the P-type portion and the N-type portion may be disposed to be non-parallel with a surface of the substrate 210.

In the plurality of semiconductor patterns 261 to 264, the doping concentration (represented by P+ in FIG. 2) of each of the P-type portions may be, for example, larger than the doping concentration of the P-type well 230, and the doping concentration (represented by N+ in FIG. 2) of each of the N-type portions may be, for example, larger than the doping concentration of the N-type well 220.

When the diode 200 is formed, the first, third and fifth periods ①, ③, and ⑤ may be doped by N-type impurity, and the second and fourth periods ② and ④ may be doped by P-type impurity. Accordingly, each P-type portion may be adjacent to one of the P-type regions 251 and 252, and each N-type portion may be adjacent to one of the N-type regions 241, 242, and 243. For example, the third N-type region 243 may be disposed between the N-type portion of the second semiconductor pattern 262 and the N-type portion of the third semiconductor pattern 263. The first P-type region 251 may be disposed between the P-type portion of the first semiconductor pattern 261 and the P-type portion of the second semiconductor pattern 262. Also, the second P-type region 252 may be disposed between the P-type portion of the third semiconductor pattern 263 and the P-type portion of the fourth semiconductor pattern 264.

In accordance with an exemplary embodiment of the inventive concept, the semiconductor patterns 261 to 264 may be doped by, for example, an N-type impurity at the same time when the first to third N-type regions 241 to 243 are doped. Further, the semiconductor patterns 261 to 264 may be doped by, for example, a P-type impurity at the same time when the first and second P-type regions 251 and 252 are doped. Thus, the semiconductor patterns 261 to 264 may be formed without an additional doping process.

Figure 3:
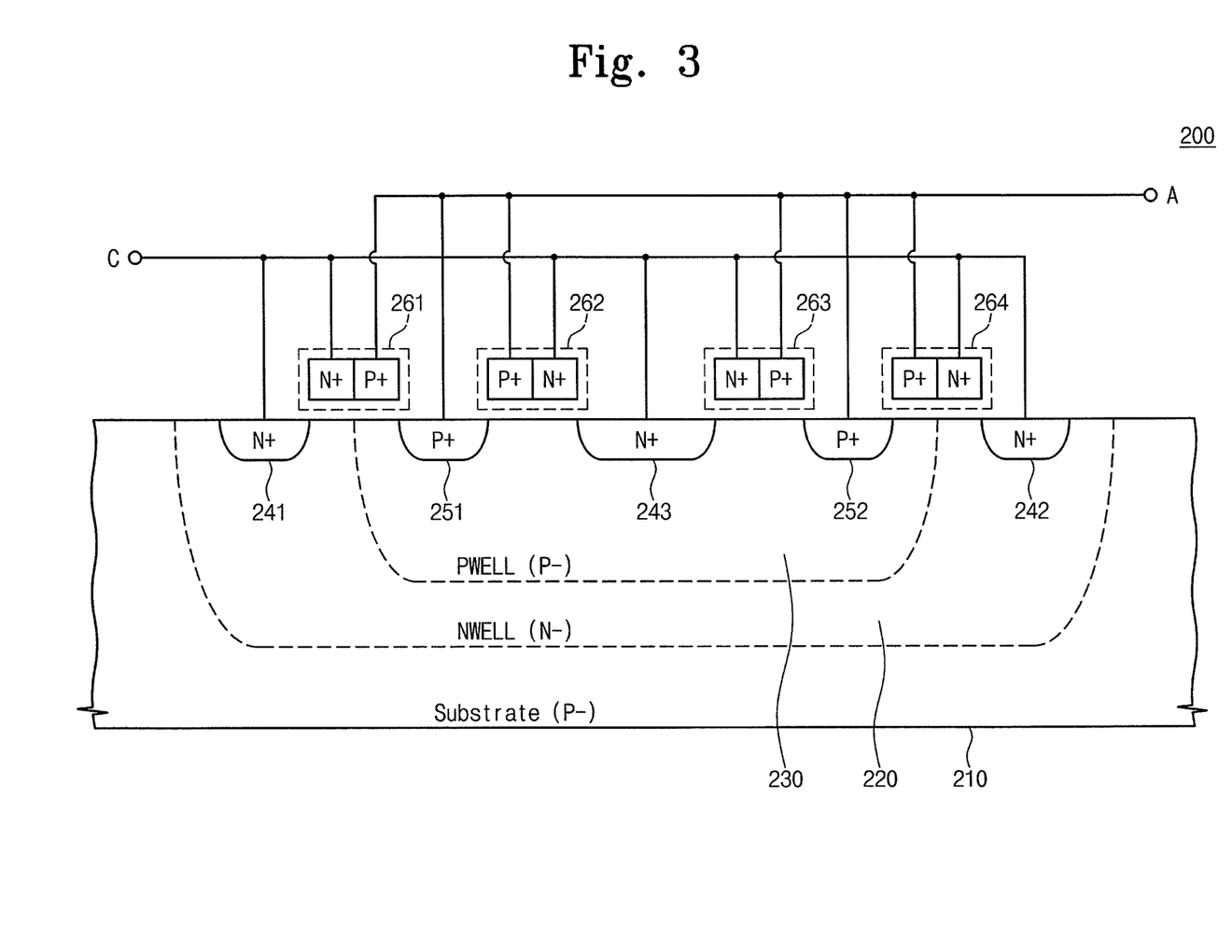
FIG. 3 is a cross-sectional view showing interconnection of an anode and a cathode coupled with a diode according to an exemplary embodiment of the inventive concept.

FIG. 3 is a cross-sectional view showing interconnection of an anode and a cathode coupled with a diode according to an exemplary embodiment of the inventive concept. Referring to FIG. 3, an anode A may be coupled with, for example, the first and second P-type regions 251 and 252 and P-type portions of semiconductor patterns 261 to 264. Thus, the first and second P-type regions 251 and 252 and the P-type portions of semiconductor patterns 261 to 264 may receive positive charges.

A cathode C may be coupled with, for example, the first to third N-type regions 241 to 243 and N-type portions of semiconductor patterns 261 to 264. Thus, the first to third N-type regions 241 to 243 and the N-type portions of semiconductor patterns 261 to 264 may receive negative charges.

In FIG. 3, there is an example of an exemplary embodiment in which an N-type well 220 includes N-type regions 241 and 242 formed therein. But, the N-type well 220 may be formed to further include P-type regions therein. At this time, the P-type regions in the N-type well 220 may be coupled with the anode A.

Figure 4:
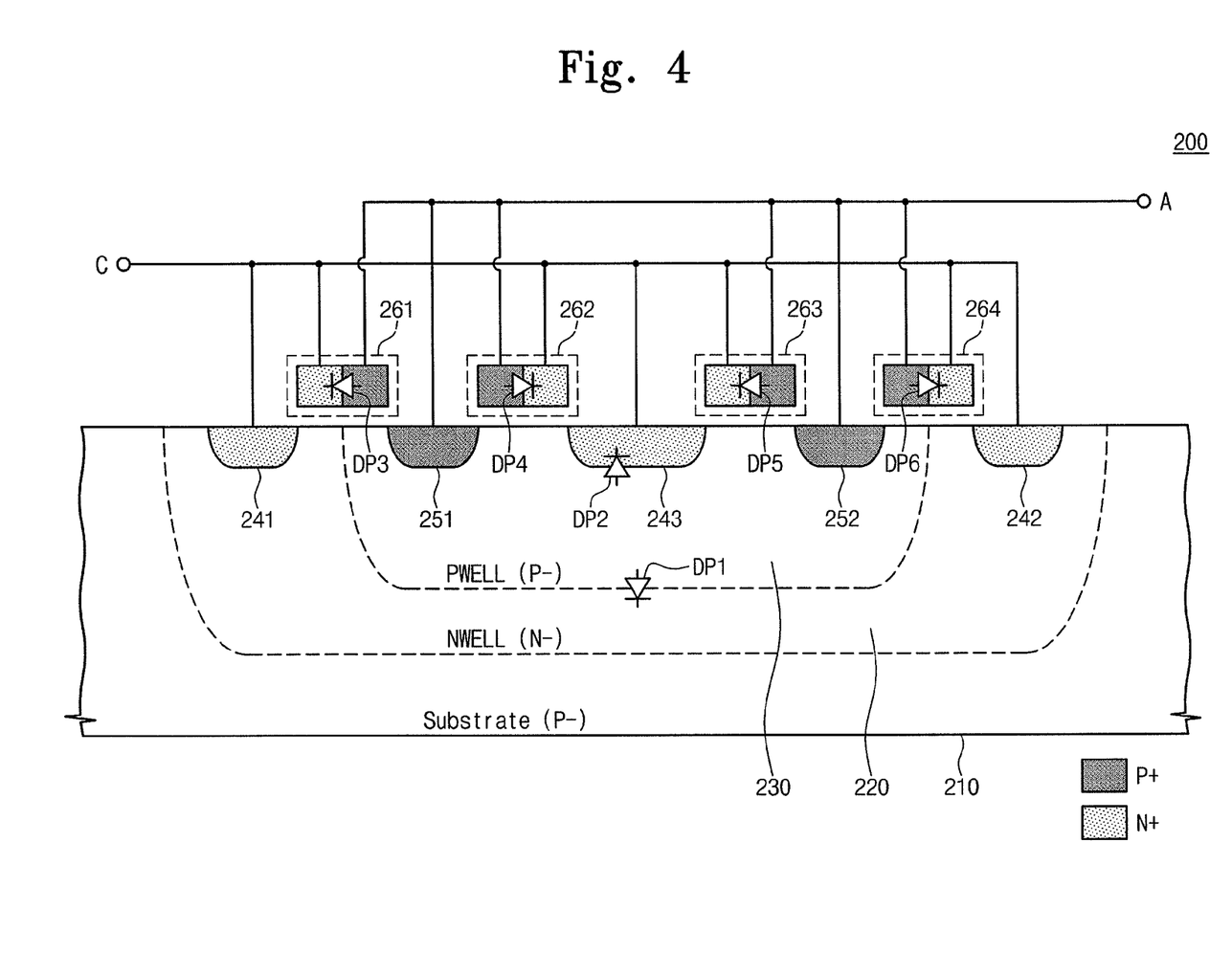
FIG. 4 shows diode elements formed from PN junctions within a diode according to an exemplary embodiment of the inventive concept.

FIG. 4 shows diode elements formed from PN junctions within a diode according to an exemplary embodiment of the inventive concept. A P-type well 230 and an N-type well 220 may form, for example, a P−/N− junction to operate as the first diode element DP1. For example, positive charges applied to the first and second P-type regions 251 and 252 may be transferred to the first and second N-type regions 241 and 242 through the P-type and N-type wells 230 and 220. The positive charges transferred to the first and second N-type regions 241 and 242 may be sent to the cathode C.

The P-type well 230 and the third N-type region 243 may form, for example, a P−/N+ junction to operate as the second diode element DP2. For example, positive charges applied to the first and second P-type regions 251 and 252 may be transferred to the cathode C through the P-type well 230 and the third N-type region 243.

The first to fourth semiconductor patterns 261 to 264 may form, for example, P+/N+ junctions to operate as the third to sixth diode elements DP3 to DP6. For example, positive charges flowing into the P-type portion of each semiconductor pattern may be sent to the cathode C through the N-type portion thereof.

In accordance with an exemplary embodiment of the inventive concept, it is possible to provide the diode 200 with the large capacity within a given area by forming a plurality of PN junctions in the diode 200.

Figure 5:
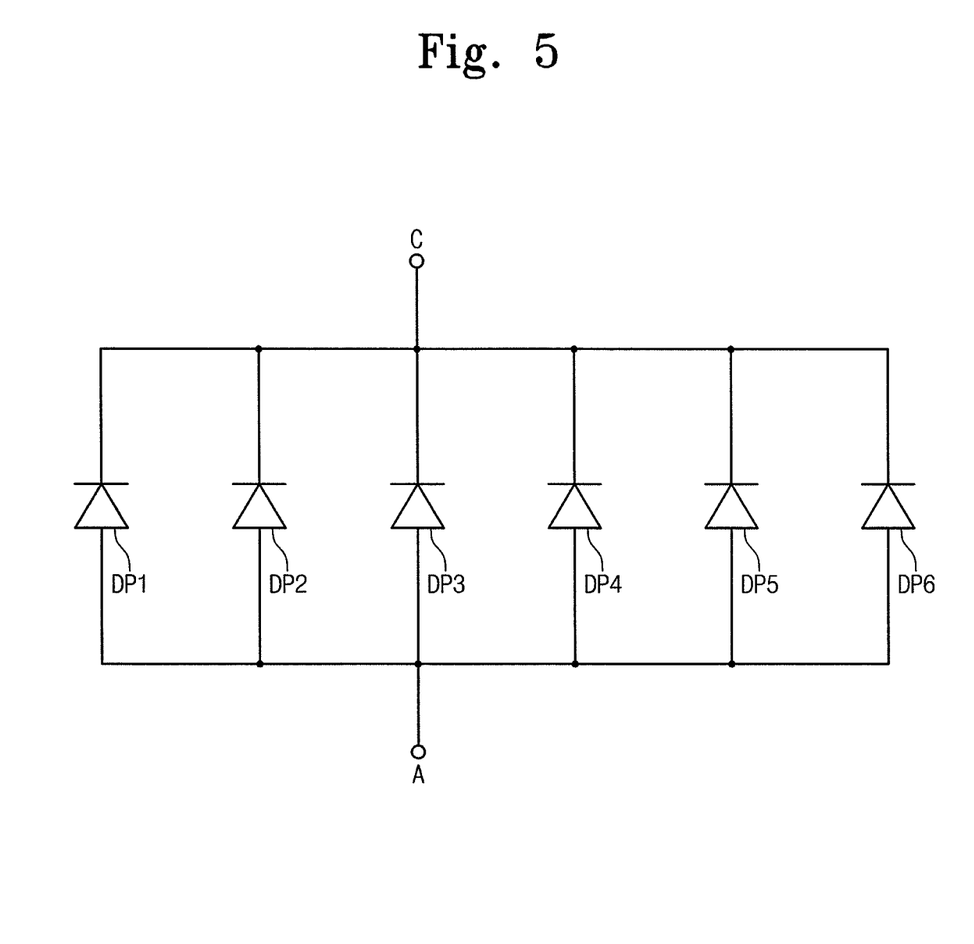
FIG. 5 is a circuit diagram of the diode illustrated in FIG. 4.

FIG. 5 is a circuit diagram of the diode illustrated in FIG. 4.

Referring to FIG. 5, the first to sixth diode elements DP1 to DP6 may be connected, for example, in parallel between an anode A and a cathode C. As the first to sixth diode elements DP1 to DP6 may be connected in parallel, the diode 200 may have a large PN junction area. That is, the capacity of the diode 200 may increase. For example, when a voltage is applied, the amount of current flowing through the diode may increase.

Figure 6:
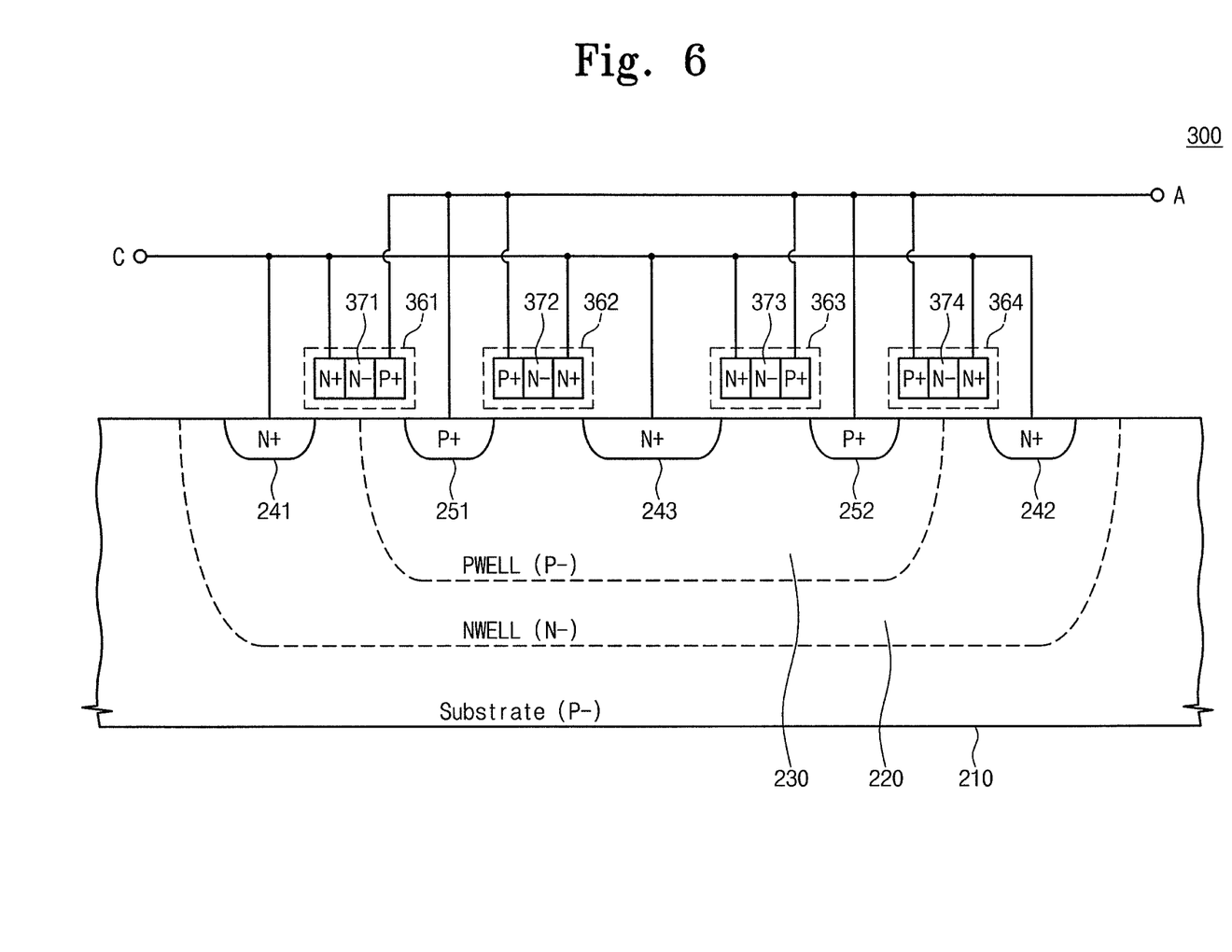
FIG. 6 is a cross-sectional view of a diode according to an exemplary embodiment of the inventive concept.

FIG. 6 is a cross-sectional view of a diode according to an exemplary embodiment of the inventive concept. A diode 300 in FIG. 6 may be configured to be identical to the diode 200 illustrated in FIG. 3 except for the first to fourth semiconductor patterns 361 to 364.

The first to fourth semiconductor patterns 361 to 364 may include, for example, portions (represented by N−) 371 to 374 lightly doped by N-type impurity. That is, each of the semiconductor patterns 361 to 364 may include, for example, a heavily doped N-type portion N+, a lightly doped N-type portion N−, and a heavily doped P-type portion P+. For example, the first to fourth semiconductor patterns 361 to 364 may act as a PIN diode, respectively. The first to fourth semiconductor patterns 361 to 364 may attenuate high-frequency voltage and current received through an anode A or a cathode C.

Unlike that illustrated in FIG. 6, alternatively, the lightly doped N-type portions 371 to 374 can be replaced with, for example, lightly doped P-type portions.

Figure 7:
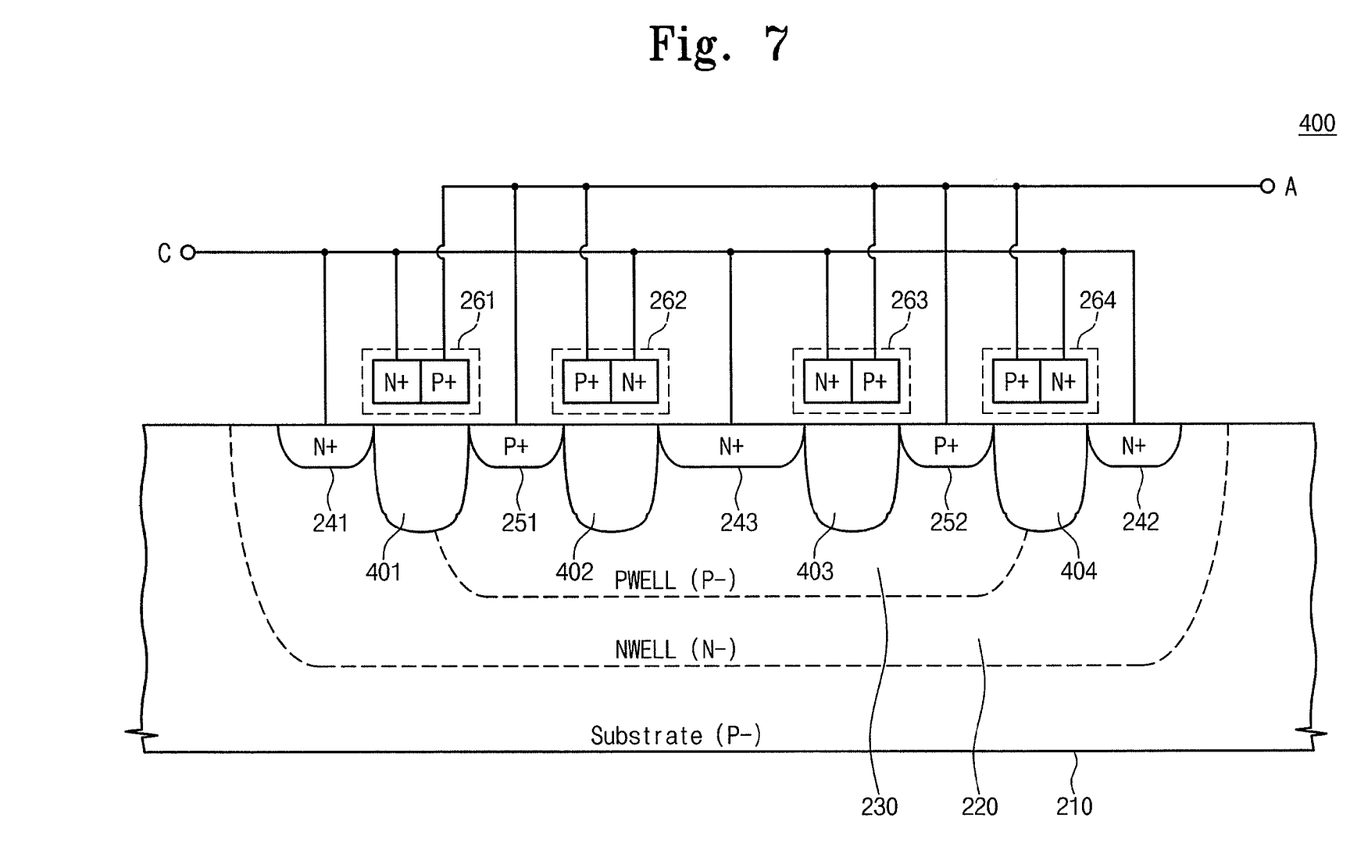
FIG. 7 is a cross-sectional view of a diode according to an exemplary embodiment of the inventive concept.

FIG. 7 is a cross-sectional view of a diode according to an exemplary embodiment of the inventive concept. Referring to FIG. 7, a diode 400 may be configured to be identical to the diode 200 illustrated in FIG. 3 except that substrate 210 further includes the first to fourth isolation patterns 401 to 404.

Each of the first to fourth isolation patterns 401 to 404 may be disposed between P-type and N-type regions. For example, the first isolation pattern 401 may be disposed between the P-type and N-type regions 241 and 251, and the second isolation pattern 402 may be disposed between the P-type and N-type regions 251 and 243. Moreover, for example, the third isolation pattern 403 may be disposed between the N-type and P-type regions 243 and 252 and the fourth isolation pattern 404 may be disposed between the P-type and N-type regions 252 and 242. The first to fourth isolation patterns 401 to 404 may be formed of, for example, an insulation material. Due to the above-mentioned positioning of the first to fourth isolation patterns 401 to 404, the regions 241 to 243, 251, and 252 may not be coupled electrically although a high voltage is applied to the first to fourth isolation patterns 401 to 404.

In an exemplary embodiment, each of the first to fourth isolation patterns 401 to 404 may be, for example, a trench-type isolation pattern. Alternatively, in an exemplary embodiment, each of the first to fourth isolation patterns 401 to 404 may be, for example, a local oxidation of silicon (LOCOS)-type isolation pattern.

In accordance with an exemplary embodiment of the inventive concept, it is possible to provide a diode with an increased capacity by including PN junctions of semiconductor patterns 261 to 264. That is, it is possible to increase the integration of the diode. It is possible to increase the amount of current flowing through the diode when a voltage is applied thereto. Further, it is possible to reduce the amount of self-heating of the diode due to a voltage applied to the diode.

As an electrostatic discharge protection circuit including a diode according to an exemplary embodiment of the inventive concept is formed within a small area, an internal circuit 120 of an integrated circuit device may be protected by the electrostatic discharge protection circuit including the diode from electrostatic discharge when a voltage is applied to the diode.

The term "a first/second type impurity" may be used to be identical to terms "a first/second conductive type impurity" and "a first/second conductive type dopant"

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A diode comprising:
    a first region having a first conductive type impurity and formed in a first well, wherein the first well has the first conductive type impurity;
    a second region formed in the first well and having a second conductive type impurity;
    a semiconductor pattern disposed on the first well and including a first portion having the first conductive type impurity and a second portion having the second conductive type impurity, wherein the first region and the first portion are coupled with an anode, and the second region and the second portion are coupled with a cathode; and
    a third region formed in a second well having the second conductive type impurity, wherein the third region has the second conductive type impurity, and
    wherein the third region is coupled with the cathode.

2. The diode of claim 1, further comprising a depletion layer disposed between the first and second portions and which is non-parallel with a surface of the first well.

3. The diode of claim 1, wherein the semiconductor pattern is disposed between the first and second regions, the first region is disposed adjacent to the first portion, and the second region is disposed adjacent to the second portion.

4. The diode of claim 1, wherein the semiconductor pattern is formed of polysilicon.

5. The diode of claim 1, wherein the semiconductor pattern further comprises a third portion disposed between the first and second portions, and the third portion has a concentration smaller than a concentration of the first portion and has the first conductive type impurity.

6. The diode of claim 1, wherein the semiconductor pattern further comprises a third portion disposed between the first and second portions, and the third portion has a concentration smaller than a concentration of the second portion and has the second conductive type impurity.

7. The diode of claim 1, further comprising:
    an isolation pattern formed in the first well and disposed between the first and second regions.

8. The diode of claim 1,
wherein the first well is formed in the second well, and the first and second wells are formed in a substrate having the first conductive type impurity.

9. The diode of claim 8, further comprising:
a fourth region formed in the second well, wherein the fourth region has the first conductive type impurity, and wherein the fourth region is coupled with the anode.

10. A diode comprising:
a plurality of semiconductor patterns disposed on a substrate and each of the semiconductor patterns including a portion having a first conductive type impurity and a portion having a second conductive type impurity; and
a plurality of regions including a first region and a second region formed in the substrate, wherein the first region has the first conductive type impurity and the second region has the second conductive type impurity,
wherein the portion having the first conductive type impurity and the first region having the first conductive type impurity are coupled with an anode,
wherein the portion having the second conductive type impurity and the second region having the second conductive type impurity are coupled with a cathode, and
wherein the first region having the first conductive type impurity is formed in a first well and the second region having the second conductive type impurity is formed in a second well, and wherein the first well has the first conductive type impurity and the second well has the second conductive type impurity.

11. The diode of claim 10, wherein the semiconductor patterns, the first region having the first conductive type impurity and the second region having the second conductive type impurity are disposed in turn.

12. The diode of claim 10, wherein the first well is formed in the second well.

13. The diode of claim 10, further comprising:
an insulation film disposed between the substrate and the semiconductor patterns.

14. A diode comprising:
a plurality of semiconductor patterns disposed on a substrate and each of the semiconductor patterns including a portion having a first conductive type impurity and a portion having a second conductive type impurity;
a plurality of regions including a first region and a second region formed in the substrate, wherein the first region has the first conductive type impurity and the second region has the second conductive type impurity,
wherein the portion having the first conductive type impurity and the first region having the first conductive type impurity are coupled with an anode,
wherein the portion having the second conductive type impurity and the second region having the second conductive type impurity are coupled with a cathode;
a third region disposed in the substrate and having the second conductivity type impurity; and
a plurality of isolation patterns formed in the substrate, wherein at least one of the isolation patterns is disposed between the first region having the first conductive type impurity and the second region having the second conductive type impurity and wherein at least another one of the isolation patterns is disposed between the first region having the first conductive type impurity and the third region having the second conductivity type impurity such that the first region, second region and third regions are not electrically coupled to each other.

* * * * *